(12) United States Patent
Honda et al.

(10) Patent No.: US 6,574,087 B1
(45) Date of Patent: Jun. 3, 2003

(54) ELECTRONIC DEVICE AND MANUFACTURE THEREOF

(75) Inventors: Kazuyoshi Honda, Osaka (JP); Noriyasu Echigo, Hyogo (JP); Masaru Odagiri, Hyogo (JP); Takanori Sugimoto, Shimane (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 117 days.

(21) Appl. No.: 09/720,279

(22) PCT Filed: Apr. 19, 2000

(86) PCT No.: PCT/JP00/02570

§ 371 (c)(1),
(2), (4) Date: Dec. 21, 2000

(87) PCT Pub. No.: WO00/65616

PCT Pub. Date: Nov. 2, 2000

(30) Foreign Application Priority Data

Apr. 23, 1999 (JP) ............................................. 11-115673

(51) Int. Cl.[7] ............................................... H01G 4/005
(52) U.S. Cl. ..................... 361/303; 361/305; 361/311; 361/313; 361/306.1; 438/612; 438/613; 257/529; 257/530
(58) Field of Search ................................. 361/303, 305, 361/311, 312, 313, 306.1, 306.3, 321.4; 438/612, 106, 613; 257/529, 530

(56) References Cited

U.S. PATENT DOCUMENTS

| 5,023,750 A | * | 6/1991 | Hirayama |
| 5,323,520 A | | 6/1994 | Peters et al. |
| 5,909,633 A | * | 6/1999 | Haji et al. |
| 5,917,229 A | * | 6/1999 | Nathan et al. |
| 6,331,347 B2 | * | 12/2001 | Haji |

FOREIGN PATENT DOCUMENTS

| JP | 4-242908 | 8/1992 |
| JP | 6-140764 | 5/1994 |

* cited by examiner

Primary Examiner—Dean A. Reichard
Assistant Examiner—Nguyen Ha
(74) Attorney, Agent, or Firm—Merchant & Gould, P.C.

(57) ABSTRACT

Electrode layers (1, 2) are arranged on both sides of a dielectric layer (3) facing each other so as to configure a capacitor. Lead electrodes (4, 5) are formed in the electrode layers (1, 2). A penetrating electrode (6) that is insulated from the electrode layers (1, 2) is formed. An electronic component (10) configured in this manner is mounted on a wiring board, and a semiconductor chip can be mounted thereon. Along with connecting the semiconductor chip to the wiring board via the penetrating electrode (6), the semiconductor chip or the wiring board is connected to the lead electrodes (4, 5). In this manner, while suppressing the size increase of a mounted area, the capacitor or the like can be arranged near the semiconductor chip. Thus, the semiconductor chip is driven with high frequency more easily.

7 Claims, 11 Drawing Sheets

ELECTRONIC DEVICE AND MANUFACTURE THEREOF

TECHNICAL FIELD

The present invention relates to an electronic component and a method for manufacturing the same.

BACKGROUND ART

The request for speeding up information processing has become more and more intensified, and a growing number of semiconductor chips with high frequency have been developed year by year. In order to speed up the semiconductor operation, not only achieving high density and high performance of integrated chips but also improving characteristics of peripheral circuits is necessary. In particular, securing the stability of a transmission line and a power supply line is one of the requirements for the stable high-speed operation. Thus, it is not going too far to say that the main body of a semiconductor chip depends heavily on the peripheral devices.

A capacitor is one of the important devices that secure the stability of the transmission line and the power supply line. In order to realize the high-speed operation, not only should the capacitor have high frequency performance, but also the wiring led thereto should have low impedance.

In order to operate the semiconductor chip with high frequency, it is necessary to arrange the capacitor near the semiconductor chip so as to reduce wiring loss. Conventional methods are limited to those of forming a minute capacitor inside the semiconductor, and this is becoming insufficient for a further high-frequency stable operation. In addition, locating the capacitor in the circumference of the semiconductor chip causes a problem in that a mounted board becomes large.

DISCLOSURE OF INVENTION

It is an object of the present invention to solve the problems noted above and to provide an electronic component and a method for manufacturing the same, wherein suppressing the size increase of the mounted area and locating a capacitor near a semiconductor chip can be realized at the same time.

In order to achieve the above-mentioned object, the present invention has configurations described below.

An electronic component according to the present invention includes electrode layers arranged in opposition to each other, a dielectric interposed between the electrode layers, a connecting electrode that is connected to at least one of the electrode layers, and penetrating electrodes that penetrate the electronic component without being connected to the electrode layers. Since the electronic component of the present invention includes the penetrating electrodes, it is possible, for example, to mount the electronic component of the present invention on a wiring board and dispose another electronic component (for example, a semiconductor chip) thereon to connect this electronic component to the wiring board via the penetrating electrode. Also, since the electronic component of the present invention includes the electrode layers and the dielectric that is interposed between the electrode layers, it is possible, for example, to form a capacitor in the electronic component. As a result, while suppressing the size increase in a mounted area, the capacitor can be arranged near the semiconductor chip, thereby realizing a high frequency driving of the semiconductor chip and suppressing the size increase of the mounted area at the same time.

It is preferable that the penetrating electrodes mentioned above penetrate the electronic component in a direction substantially in parallel to the deposition direction of the electrode layer and the dielectric. The electronic component with such a configuration is easy to manufacture.

In the electronic component of the present invention described above, the penetrating electrodes are arranged like lattice points, the electrode layers include a first electrode layer and a second electrode layer arranged between the penetrating electrodes, and the first electrode layer and the second electrode layer are arranged so as to be crossed with each other like a lattice when seen from a penetrating direction of the penetrating electrodes and so that the dielectric is interposed therebetween. Alternatively, the electrode layers may include a first electrode layer and a second electrode layer that are arranged so as to have a facing portion with a predetermined size and so that the dielectric is interposed therebetween. With this configuration, a capacitor with a desired capacity can be formed easily in the electronic component.

In the electronic component of the present invention, the connecting electrode can be a lead electrode that is formed in the same plane as the penetrating electrode. In other words, the lead electrode and the penetrating electrode can be formed so as to be exposed to the same surface of the electronic component. With this configuration, the lead electrode can be connected to the wiring board, which is used for supplying voltage to the electrode layers in the electronic component, on the same plane as the penetrating electrode (for example, the bottom surface or the top surface of the electronic component) in a similar manner. As a result, the mounted area can be further decreased. Also, another electronic component that is disposed on the electronic component of the present invention can be connected to the lead electrode easily.

In addition, in the electronic component of the present invention, the connecting electrode can be an external electrode that is formed in a different plane than the penetrating electrode. For example, the penetrating electrode is formed so as to be exposed to the upper and lower outer surfaces of the electronic component, and the connecting electrode (the external electrode) is formed on the peripheral surface of the electronic component. With this configuration, when mounting the electronic component of the present invention on the wiring board, the external electrode can be soldered to the wiring board easily.

In the electronic component of the present invention, it is preferable that a plurality of capacitance forming regions are formed between the first electrode layers and the second electrode layers. Thus, a capacitor can be formed inside the electronic component.

It is preferable that the connecting electrodes that are connected to the first electrode layers and the second electrode layers forming the capacitance forming regions are insulated from each other. With this configuration, a plurality of independent capacitors can be formed inside the electronic component.

Furthermore, when the capacitance forming regions with different capacitances are formed, a plurality of capacitors with different capacity can be formed inside the electronic component.

Next, a method for manufacturing the electronic component according to the first configuration of the present invention is described in the following. The method for manufacturing the electronic component including a plurality of metal thin films and dielectric thin films includes (i)

depositing a metal thin film, (ii) depositing a dielectric thin film having an opening, and (iii) performing (i) and (ii) a plurality of times, so that the metal thin films are electrically connected to each other via the opening. With this configuration, a simple method can connect desired metal thin films to each other among metal thin films that are layered in the electronic component. Therefore, lead electrodes are formed on the metal thin films that are connected in this manner, enabling a plurality of metal thin films, which are connected, to function as electrode layers with the same electric potential.

In the above-described method for manufacturing the electronic component of the first configuration of the present invention, the dielectric thin film having the opening can be obtained by depositing the dielectric thin film and then irradiating a laser beam to a predetermined portion to remove a part of the dielectric thin film. Thus, the dielectric thin film with the opening can be formed easily and efficiently on a desired position in a precise manner.

It is preferable that the laser beam is a carbon dioxide gas laser. Thus, only the dielectric thin film can be removed efficiently without causing a deterioration of the metal thin film.

Alternatively, in the above-described method for manufacturing the electronic component of the first configuration of the present invention, the dielectric thin film having the opening may be obtained by oil masking. Thus, the dielectric thin film with the opening can be formed easily and efficiently at low cost.

It is preferable that an oil used for the oil masking is a hydrocarbon-based oil, a mineral oil or a fluorocarbon oil. Since these oils have an excellent wettability to the metal thin film and reliably prevent the resin thin film material from adhering, the opening with a clear border can be formed reliably.

Also, in the above-described method for manufacturing the electronic component of the first configuration of the present invention, it is preferable that, after (iii), a part of the metal thin film is exposed to a surface of the layered product that is obtained in a deposition direction. With this configuration, the exposed portion of the metal thin film can be made into the lead electrode.

It is preferable that a conductive substance is put on a surface to which the metal thin film is exposed. In other words, it is preferable that the conductive substance is adhered to the exposed portion of the metal thin film so as to be on the same plane as or protrude from the outer surface of the electronic component because of easy leading out of the electrode and connection to the wiring board and the other electronic components.

Next, a method for manufacturing the electronic component according to the second configuration of the present invention is described in the following. The method for manufacturing the electronic component including a plurality of dielectric thin films includes depositing a dielectric thin film having an opening in a predetermined portion a plurality of times, so that a layered product that comprises the dielectric thin film with a penetrating hole that penetrates in a deposition direction is obtained. With this configuration, a simple method can form the penetrating hole for the penetrating electrode that penetrates the electronic component in the deposition direction.

In the above-described method for manufacturing the electronic component of the second configuration of the present invention, the dielectric thin film having the opening can be obtained by depositing the dielectric thin film and then irradiating a laser beam to a predetermined portion to remove a part of the dielectric thin film. Thus, the dielectric thin film with the opening can be formed easily and efficiently on a desired position in a precise manner.

It is preferable that the laser beam is a carbon dioxide gas laser. Thus, removing only the dielectric thin film can be done efficiently.

Alternatively, in the above-described method for manufacturing the electronic component of the second configuration of the present invention, the dielectric thin film having the opening may be obtained by oil masking. Thus, the dielectric thin film with the opening can be formed easily and efficiently at low cost.

It is preferable that an oil used for the oil masking is a hydrocarbon-based oil, a mineral oil or a fluorocarbon oil. Since these oils have an excellent wettability to the metal thin film and reliably prevent the resin thin film material from adhering, the opening with a clear border can be formed reliably.

Also, in the above-described method for manufacturing the electronic component of the second configuration of the present invention, it is preferable that, after a plurality of times of depositing the dielectric thin films, a conductive substance is filled in the penetrating hole of the layered product that is obtained. Thus, a penetrating electrode that penetrates the electronic component in the deposition direction can be obtained. In this case, it is preferable that the surface of the filled conductive substance is made to be on the same plane as or slightly protrude from the outer surface of the layered product because of the easy connection to the wiring board and the other electronic components.

Next, a method for manufacturing the electronic component according to the third configuration of the present invention includes forming a metal thin film that is patterned in a predetermined shape, forming a dielectric thin film having an opening in a region where the metal thin film is not formed, forming a metal thin film that is patterned in a predetermined shape in a region without the opening on the dielectric thin film, and filling a conductive substance in the opening. With this configuration, a simple method can form a penetrating electrode that penetrates the electronic component in the deposition direction and is not connected to the metal thin film in the electronic component. In addition, a desired circuit configuration that is independent of such a penetrating electrode can be provided to the same electronic component. Thus, it is possible, for example, to mount the electronic component obtained by the method of the present invention on a wiring board and dispose another electronic component (for example, a semiconductor chip) thereon to connect this electronic component to the wiring board via the penetrating electrode. Also, since the electronic component obtained by the method of the present invention includes the metal thin films and the dielectric thin film that is interposed between the metal thin films, it is possible, for example, to form a capacitor in the electronic component. As a result, while suppressing the size increase of a mounted area, the capacitor can be arranged near the semiconductor chip, thereby realizing a high frequency driving of the semiconductor chip and suppressing the size increase of the mounted area at the same time.

In the above-described method for manufacturing the electronic component of the third configuration of the present invention, it is preferable that the conductive substance is electrically insulated from the metal thin films. With this configuration, for example, a circuit board and the other electronic component are electrically connected to each other via the penetrating electrode as if there was not the electronic component of the present invention between them.

Also, in the above-described method for manufacturing the electronic component of the third configuration of the present invention, it is preferable that said metal thin films are formed so as to be substantially stripe-shaped. With this configuration, the electronic component having the above configuration can be manufactured efficiently.

It is preferable that the substantially stripe-shaped metal thin film is formed so that a direction of the stripe crosses the one formed thereunder (so that stripe directions of a metal thin film and its adjacent metal thin film are like skew lines). Thus, since the metal thin films above and below the dielectric thin film have a predetermined overlapped portion in the deposition direction, a capacitance forming region can be formed in this portion. The directions of the stripes of the metal thin films do not have to cross perpendicularly, and may cross obliquely.

Also, in the above-described method for manufacturing the electronic component of the third configuration of the present invention, it is preferable that both of the metal thin films that are formed on both sides of the dielectric thin film overlap with a predetermined size in a deposition direction. Thus, a patterning shape of the metal thin film can be designed optionally, and the capacitance forming region can be formed at the same time.

Also, in the above-described method for manufacturing the electronic component of the third configuration of the present invention, it is preferable that an electrode that is electrically connected to at least a part of the metal thin films is formed on a surface substantially perpendicular to a surface on which the metal thin film is formed. With this configuration, the electronic component having an external electrode on a surface different from the surface on which the penetrating electrode is formed (the outer surface of the electronic component to which the penetrating electrode is exposed) can be obtained.

It is preferable that a plurality of the electrodes are formed and a part of or all of the electrodes are electrically insulated from each other. Thus, a plurality of independent capacitors can be formed in the electronic component. Also, changing the size and number of the metal thin films connected to one electrode can change a capacitance of each capacitor.

It is preferable that the electrodes are formed by a method including one of thermal spraying, plating and applying. Thus, the external electrode can be formed efficiently.

In the above-described method for manufacturing the electronic component of the third configuration of the present invention, it is preferable that the dielectric thin film has a second opening in a region where the metal thin films are formed and electrically connects both of the metal thin films that are formed on both sides of the dielectric thin film via the second opening. With this configuration, a simple method can connect desired metal thin films to each other among metal thin films that are layered in the electronic component. Therefore, lead electrodes are formed on the metal thin films that are connected in this manner, enabling a plurality of metal thin films, which are connected, to function as electrode layers with the same electric potential.

In the above configuration, the dielectric thin film having the opening (and the second opening) can be obtained by depositing the dielectric thin film and then irradiating a laser beam to a predetermined portion to remove a part of the dielectric thin film. Alternatively, the dielectric thin film having the opening (and the second opening) also can be obtained by oil masking.

In the above-described method for manufacturing the electronic component of the third configuration of the present invention, the patterned metal thin film can be formed by forming the metal thin film after applying a solid mask or an evaporative mask, or by forming the metal thin film followed by a laser etching. With this configuration, the metal thin film with a desired shape can be obtained easily and efficiently.

Next, a method for manufacturing the electronic component according to the fourth configuration of the present invention includes obtaining a layered product by a plurality of times of depositing a metal thin film that is patterned in a predetermined shape and a dielectric thin film, forming a hole in the layered product in a deposition direction, and filling a conductive substance in the hole. With this configuration, an opening is not formed in the dielectric thin film while manufacturing the layered product and a hole is formed after obtaining the layered product, thereby simplifying the apparatus for manufacturing the layered product.

In the above-described method for manufacturing the electronic component of the fourth configuration of the present invention, the hole can be a penetrating hole that is formed so as not to penetrate said metal thin films. Thus, the penetrating electrode can be formed easily.

Also, a plurality of layers of the metal thin film are formed and the hole is formed so that a part of the metal thin films is exposed to an inner wall of the hole. Then, filling the conductive substance so as to be connected to the exposed metal thin film can form a lead electrode easily. It is possible for the hole here to penetrate or not to penetrate the electronic component.

In the above-described method for manufacturing the electronic component of the fourth configuration of the present invention, it is preferable that the hole is formed by irradiating a laser beam. With this configuration, the hole can be formed efficiently. The laser beam source used here is preferably selected considering whether or not it penetrates the metal thin film layers at the same time.

In addition, in the above-described method for manufacturing the electronic component of the fourth configuration of the present invention, an electrode that is electrically connected to at least a part of the metal thin films also can be formed on a surface substantially perpendicular to a surface on which the metal thin film is formed. With this configuration, the electronic component can have an external electrode on a surface different from the surface on which the holes are formed.

BEST MODE FOR CARRYING OUT THE INVENTION

The following is a description of the embodiments of the present invention, with reference to the accompanying drawings.

(First Embodiment)

Figure 1:
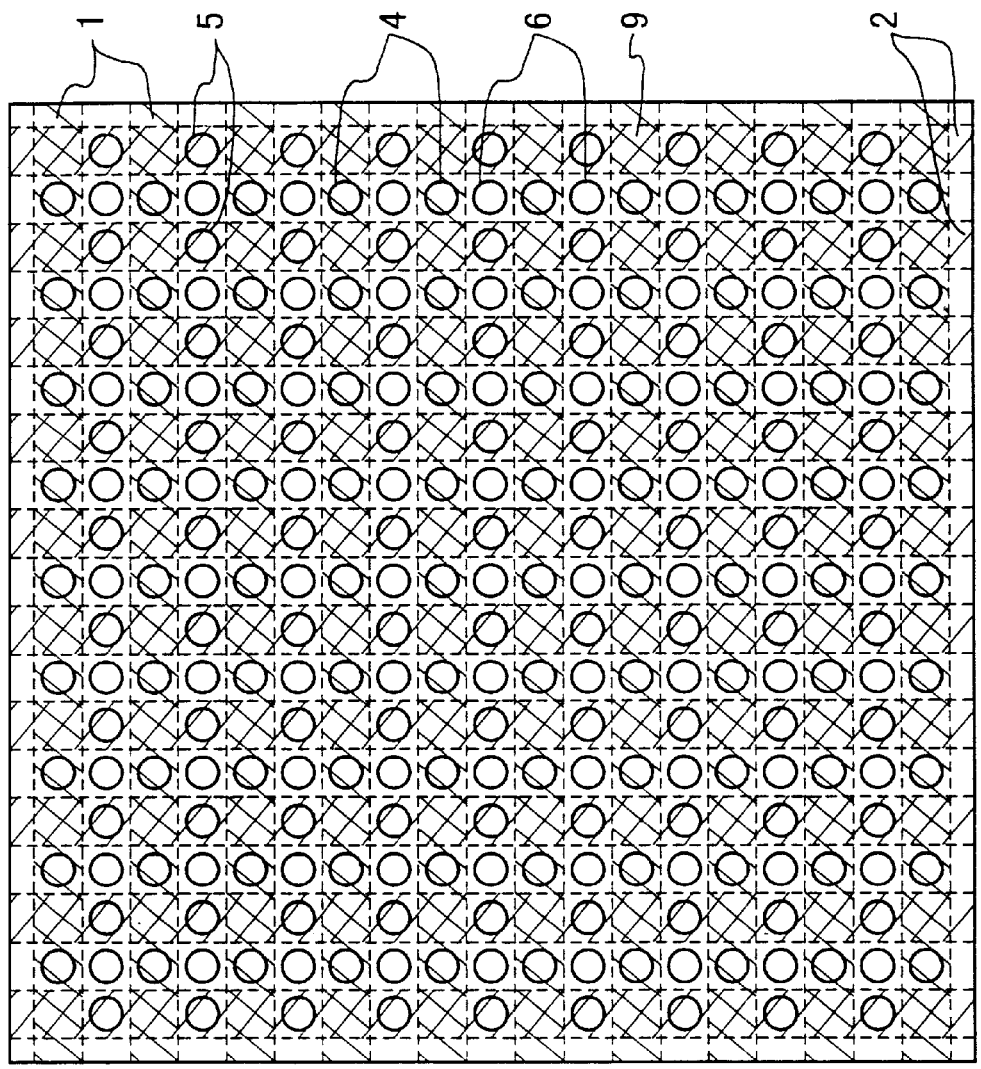
FIG. 1 is a schematic plan view showing an example of an electronic component according to the first embodiment of the present invention.
Figure 2:
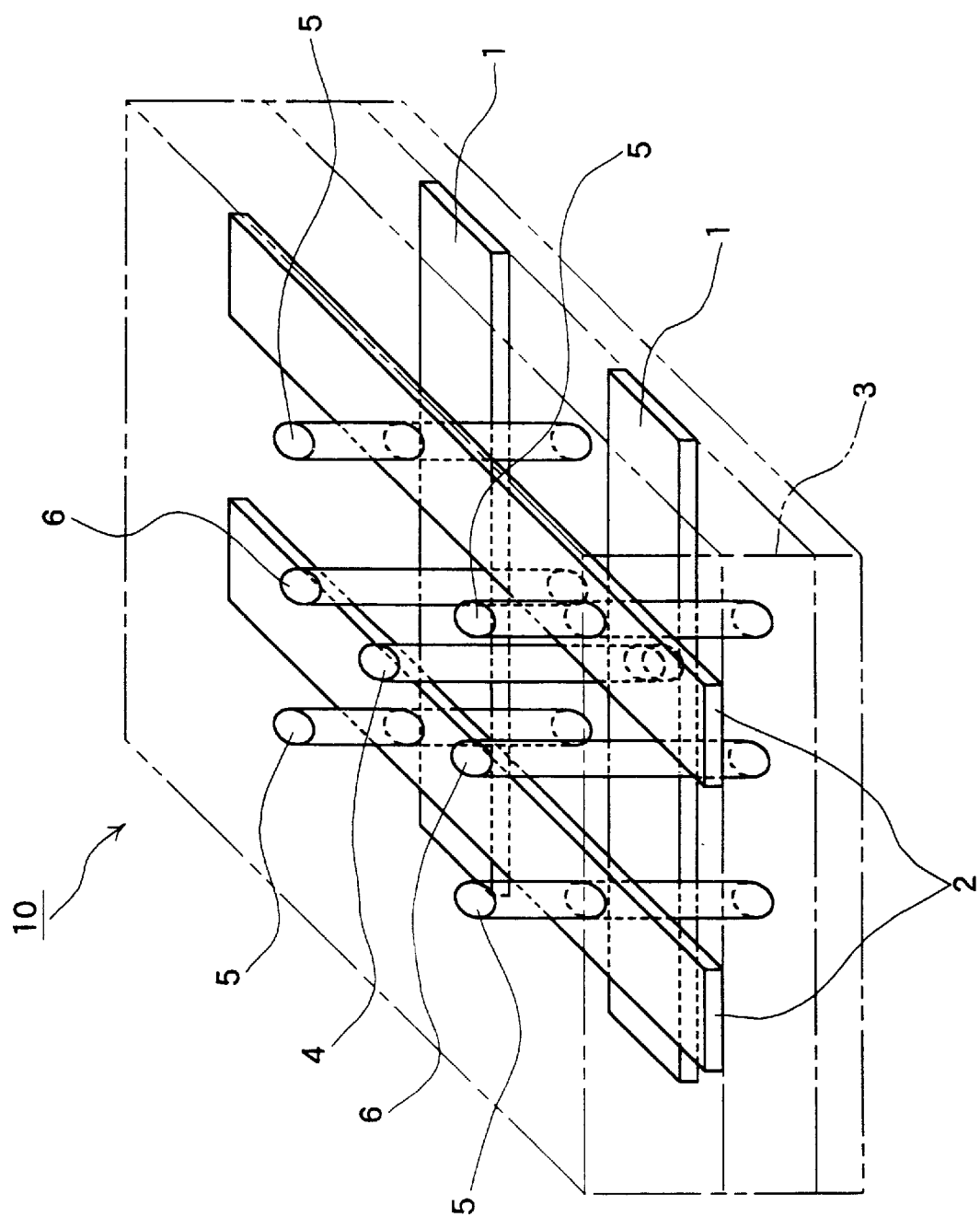
FIG. 2 is a perspective view showing an internal structure of a part of the electronic component of FIG. 1.

FIG. 1 is a schematic plan view showing an example of an electronic component 10 according to the first embodiment of the present invention. FIG. 2 is a perspective view showing an internal structure of a part of the electronic component of FIG. 1.

A plurality of first electrode layers 1 are formed so as to be stripe-shaped (band shaped) on substantially the same plane, and a plurality of second electrode layers 2 are formed so as to be stripe-shaped (band shaped) on substantially the same plane. They are layered so that a dielectric layer 3 is interposed between the first electrode layers 1 and the second electrode layers 2. By crossing the directions of the stripes of the first electrode layers 1 and the second electrode layers 2, capacitance forming regions 9 are formed at the intersections and function as capacitors.

A first lead electrode 4 is connected to the first electrode layer 1, and a second lead electrode 5 is connected to the second electrode layer 2. They can be used as joining terminals when the capacitance forming region 9 functions as a capacitor as is mentioned above. The lead electrodes 4 and 5 may be formed so as to penetrate the electronic component 10 in the deposition direction as shown in FIGS. 1 and 2, or to appear only on one surface of the electronic component. It is possible that one of the lead electrodes 4 and 5 is formed so as to penetrate the electronic component, and the other one appears only on one surface thereof.

Besides the lead electrodes 4 and 5, penetrating electrodes 6 are formed in the electronic component 10. These penetrating electrodes 6 electrically connect the other electronic components that are arranged above and below the electronic component 10 of the present invention, as if there was not the electronic component of the present invention between them.

A material for forming the electrode layers 1 and 2 can be a metal such as aluminum, copper or gold or a metal compound. A material for forming the dielectric layer 3 can be a resin material such as acrylic resin, epoxy resin or vinyl resin, a ceramic material such as barium titanium oxide-based ceramic or strontium titanium oxide-based ceramic, a metallic oxide such as titanium oxide or aluminum oxide, or a semimetallic oxide such as silicon oxide. Also, a material for forming the lead electrodes 4 and 5 and the penetrating electrodes 6 can be a conductive paste or a conductive polymer in addition to a metal such as gold, silver, aluminum, copper or a solder material.

The electrode layers 1 and 2 can be formed by vacuum evaporation, sputtering or plating or the like. Also, the electrode layers 1 and 2 can be formed so as to be stripe-shaped by using a solid mask with patterning, using an evaporative mask of oil or the like, or laser etching accordingly. The oil masking material can be various types of oils such as hydrocarbon-based oil, mineral oil or fluorocarbon oil.

The dielectric layer 3 can be formed by the following methods. When the resin-based material is used, it is vaporized by heating or atomized by ultrasonic waves or spraying, followed by being deposited. When the ceramic material or the metal-based material is used, sputtering, evaporation or the like can be selected.

In order to form the lead electrodes 4 and 5 and the penetrating electrodes 6, openings are formed in the dielectric layer 3 by the following methods. After forming the dielectric layer, dielectric in a predetermined portion is removed by laser etching. Alternatively, after applying the evaporative mask such as oil, the dielectric layer is formed. A dotted evaporative mask can be applied effectively by an ink jet system in which micro-drops of a masking material are ejected from micropores.

When applying the oil mask, the oil such as hydrocarbon-based oil, mineral oil or fluorocarbon oil can be used.

When using the evaporative mask, surplus masking material that remains after forming each layer can be removed by a far-infrared ray heater, an electron beam, an ultraviolet ray lamp irradiation or a plasma irradiation when necessary.

Figure 3:
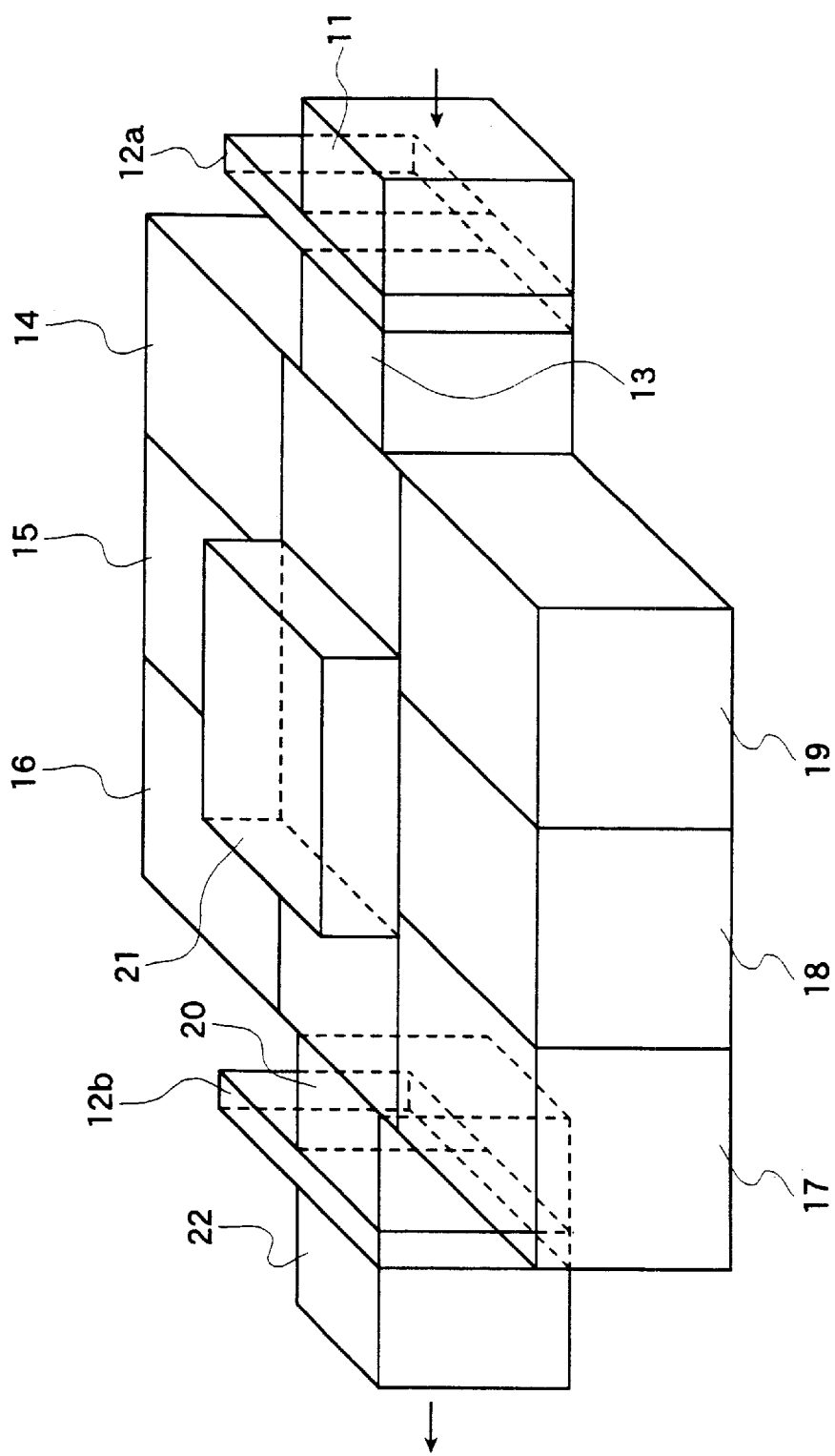
FIG. 3 is a schematic perspective view showing an apparatus for manufacturing the electronic component of FIG. 1.

FIG. 3 is a schematic perspective view of an apparatus for describing a part of an example of steps of manufacturing the electronic components of FIGS. 1 and 2.

A support is brought in from a chamber 11 for bringing in the support that is disposed on the right of the apparatus, taken through predetermined steps and then taken out from a gate 22 for taking out the support that is disposed on the left. A plurality of chambers that are divided by each step are arranged between gate valves 12a and 12b and formed in a vacuum tank in which a predetermined degree of vacuum is maintained. A conveyer system 21 that is disposed substantially in the center of the apparatus moves the support from one chamber to the other so that a predetermined processing is performed. A substrate including, for example, sheet-like or plate-like resin, ceramics or metal can be used as the support, and dielectric thin films and metal thin films are deposited thereon.

The support that is brought into the chamber 11 for bringing in the support is then brought into the vacuum tank via the opened gate valve 12a. First, a lower insulator film-forming source 13 forms a lower insulator film on the support surface. By using a patterning mask or by irradiating a laser beam, openings (holes) may be formed where the penetrating electrodes and the lead electrodes will be formed. Subsequently, a combination of a metal thin film-forming source 14 and a patterning mask forms a first patterned metal thin film (a first electrode layer). Then, a dielectric thin film-forming source 15 forms a first dielectric thin film (a dielectric layer). After forming the first dielectric thin film, a laser beam machine 16 removes the dielectric thin film where the lead electrodes and the penetrating electrodes will be formed. Next, a combination of a metal thin film-forming source 17 and a patterning mask forms a second patterned metal thin film (a second electrode layer). Then, a dielectric thin film-forming source 18 forms a second dielectric thin film (a dielectric layer). Also after forming the second dielectric thin film, a laser beam machine 19 removes the dielectric thin film where the lead electrodes and the penetrating electrodes will be formed. Subsequently, the support is transmitted again to the metal thin film-forming source 14, the dielectric thin film-forming source 15, the laser beam machine 16, the metal thin film-forming source 17, the dielectric thin film-forming source 18 and the laser beam machine 19 in this order to be processed as above for a predetermined number of times. After forming films for the predetermined times, an upper insulator film-forming source 20 forms an upper insulator film. By using a patterning mask or by irradiating a laser beam, openings (holes) may be formed where the penetrating electrodes and the lead electrodes will be formed. Then, the gate valve 12b opens so that the support is taken out from the gate 22 for taking out the support.

The penetrating electrode is formed as follows. A conductive paste is painted to fill a penetrating hole that is formed, and then hardened.

The lead electrode may be formed in a similar manner. A conductive paste is painted to fill an opening that is formed in the upper insulator film and/or the lower insulator film so as to be connected to the metal thin film exposed to the opening. The end of the lead electrode may be in the same plane as or slightly protrude from the surface of a layered product.

In an appropriate step afterwards, the layered product is cut into predetermined sizes where necessary.

Figure 4:
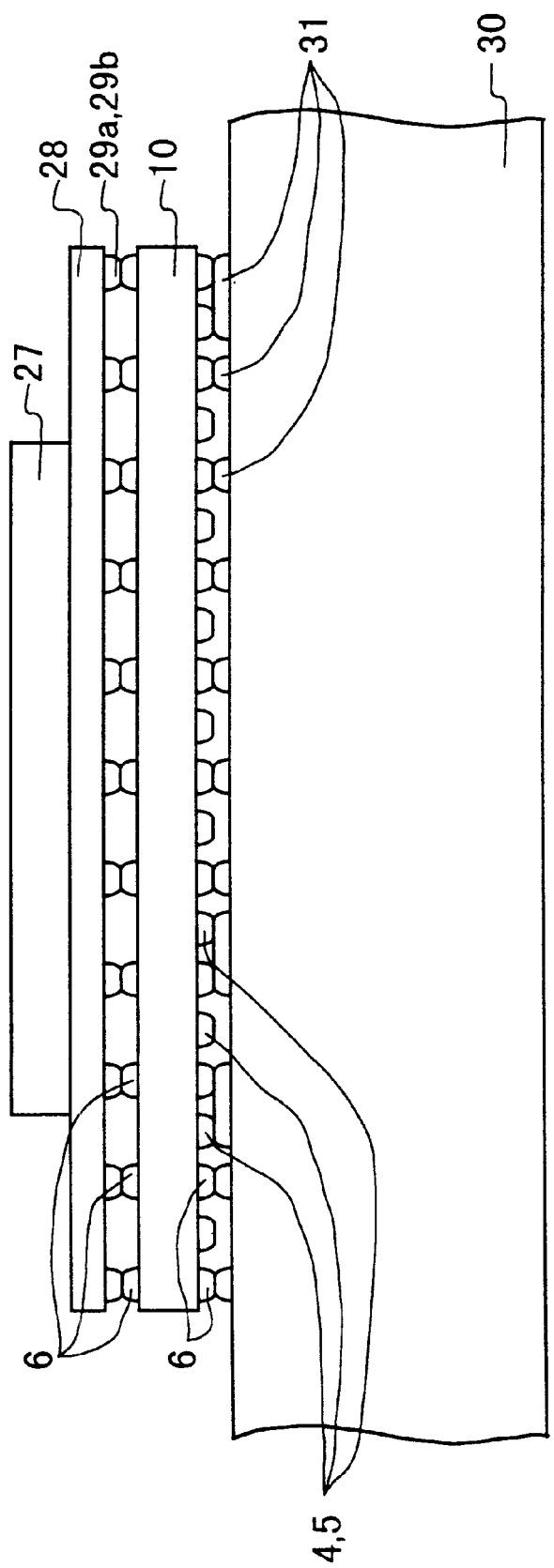
FIG. 4 is a schematic view showing an example using the electronic component of FIG. 1.

The electronic component 10 formed according to the present invention is used, for example, by locating it between a carrier 28 that has a semiconductor chip 27 mounted thereon and a wiring board 30, as is schematically shown in FIG. 4. A signal terminal 29a on the lower surface of the carrier 28 is connected to a wiring pattern 31, which is formed on the wiring board 30, via the penetrating electrode 6 of the electronic component 10 of the present invention when necessary. Also, one power terminal 29b on the lower surface of the carrier 28 is connected to the wiring board 30 via the penetrating electrode 6 and further to the first lead electrode 4. The other power terminal 29b on the lower surface of the carrier 28 is connected to the wiring board 30 via the penetrating electrode 6 and further to the second lead electrode 5. The penetrating electrode 6 and the lead electrodes 4 and 5 may be connected with the wiring pattern 31 on the surface of the wiring board 30 as is shown in FIG. 4, or with other means such as a connection inside the wiring board 30.

Since the first electrode layer 1 connected to the first lead electrode 4 and the second electrode layer 2 connected to the second lead electrode 5 are insulated by the dielectric layer interposed therebetween, when a power terminal connected to the first lead electrode 4 is a Vcc terminal and a power terminal connected to the second lead electrode 5 is a GND terminal, for example, the capacitor formed between the first lead electrode 4 and the second lead electrode 5 does not substantially enlarge the mounted area and functions as a pass capacitor for power supply near the semiconductor chip. This is preferable in high frequency driving and a size reduction of the mounted area.

EXAMPLE 1

Aluminum was used as a metal thin film material, aluminum oxide was used as a dielectric material, and silver-based paste was used as a conductive paste. As a method for forming holes for electrodes in the dielectric layer, an ink jet system was adopted. The ink jet system includes putting an oil masking material on a predetermined portion before forming the dielectric layer. Fluorocarbon oil was used as the oil masking material. Within an area 17 mm square, 484 penetrating electrodes with a diameter of 0.25 mm were formed on 0.8 mm-pitch lattice points, and 462 lead electrodes 4 of the electrode layers 1 and 462 lead electrodes 5 of the electrode layers 2 with a diameter of 0.25 mm respectively were formed on 0.8 mm-pitch lattice points between the penetrating electrodes. The electrode layers 1 and 2 were both 0.65 mm-wide multiple stripes. Depositing the electrode layer with a thickness of 30 nm and the dielectric layer with a thickness of 0.5 $\mu$m was repeated so as to obtain 80 dielectric layers. Insulator layers with a thickness of 4 $\mu$m respectively were formed on the upper and lower sides of the layered product to improve its strength. The upper and lower insulator layers were made of the same material as the dielectric layer for simplification. The lower insulator layer was processed to form holes for the penetrating electrodes and the lead electrodes by masking. The upper insulator layer also was processed to form holes for the penetrating electrodes by masking. A conductive paste was painted to fill the concave portion (opening) formed by the hole processing for the penetrating electrodes and the lead electrodes and hardened afterwards.

An LCR meter confirmed the result that a capacitor with a total capacity of 1 $\mu$F and tan δ1.2% was formed inside the layered product having a thickness of about 50 $\mu$m. The same result was obtained when using a fine line of solder material instead of the conductive paste.

(Second Embodiment)

Figure 5:
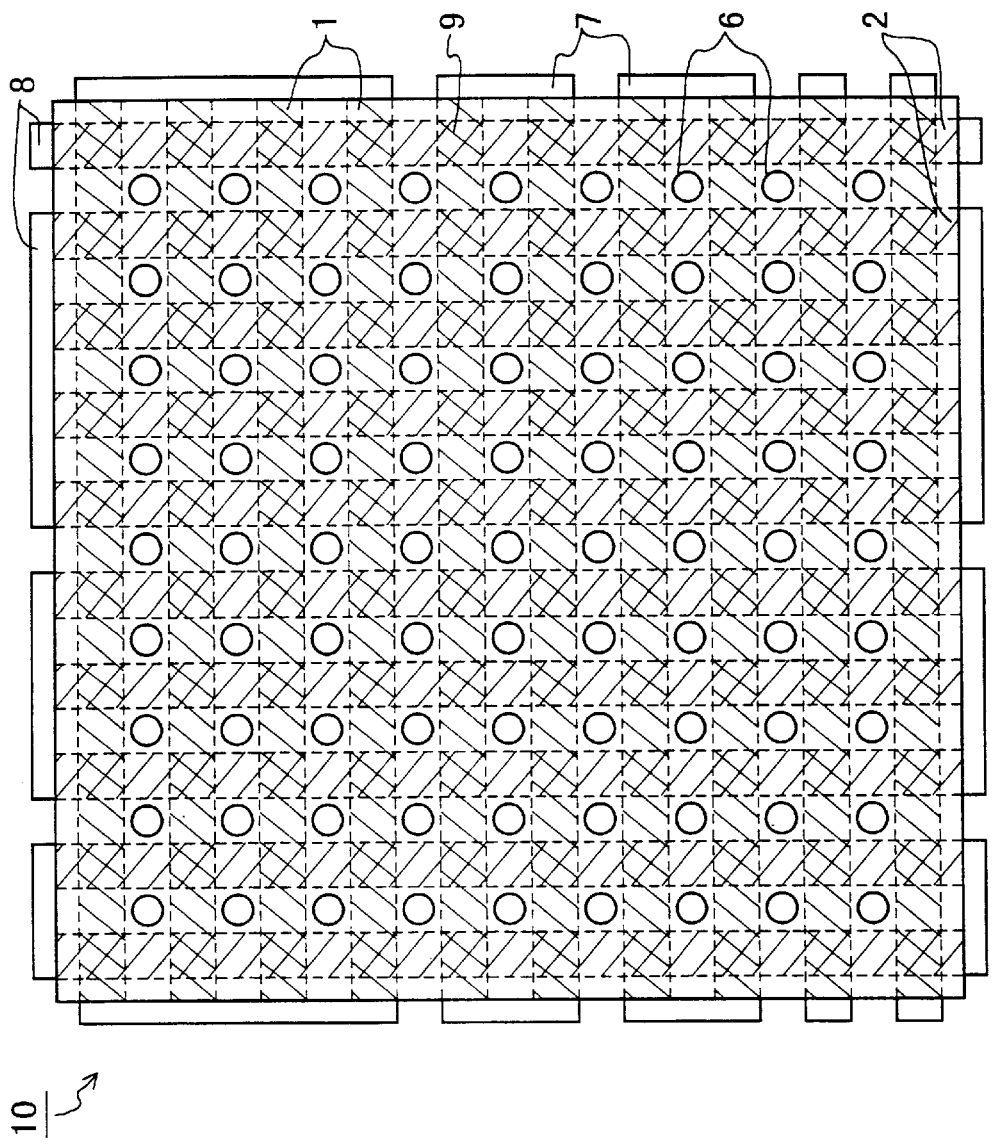
FIG. 5 is a schematic plan view showing an example of an electronic component according to the second embodiment of the present invention.
Figure 6:
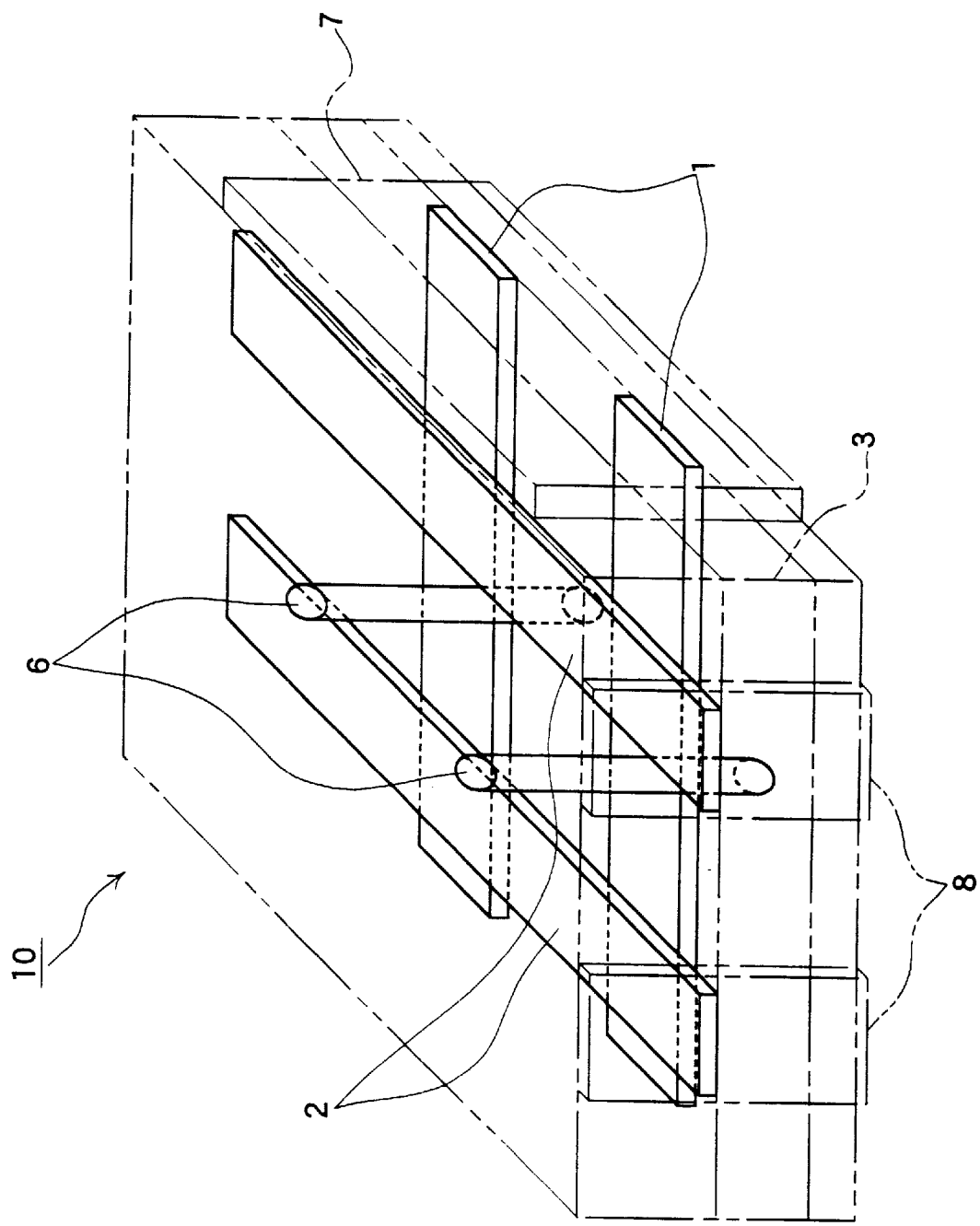
FIG. 6 is a perspective view showing an internal structure of a part of the electronic component of FIG. 5.

FIG. 5 is a schematic plan view showing another example of the electronic component 10 according to the second embodiment of the present invention. FIG. 6 is a perspective view showing an internal structure of a part of the electronic component of FIG. 5.

A plurality of first electrode layers 1 are formed so as to be stripe-shaped on substantially the same plane, and a plurality of second electrode layers 2 are formed so as to be stripe-shaped on substantially the same plane. They are layered so that a dielectric layer 3 is interposed between the first electrode layers 1 and the second electrode layers 2. By crossing the directions of the stripes of the first electrode layers 1 and the second electrode layers 2, capacitance forming regions 9 are formed at the intersections and function as capacitors.

External electrodes 7 and 8 are formed on the peripheral surfaces of the electronic component 10. A first external electrode 7 is connected to the first electrode layer 1, and a second external electrode 8 is connected to the second electrode layer 2 in an electrical manner respectively. They can be used as joining terminals when the capacitance forming region 9 functions as capacitor as is mentioned above. The external electrodes 7 and 8 may be formed on both sides of the electronic component facing each other as shown in FIG. 5 or only on one side thereof. It is possible to form one of the external electrodes 7 and 8 on both sides, and the other one only on one side of the electronic component. Also, the external electrodes 7 and 8 may be formed so as to reach both surfaces (top and bottom surfaces) in the deposition direction of the electronic component 10 as shown in FIG. 6, or only one surface thereof. It is possible that one of the external electrodes 7 and 8 reaches both surfaces, and the other one only one surface of the electronic component. In addition, plural stripes of the electrode layers 1 (or 2) may be connected to one external electrode 7 (or 8). Accordingly, a capacity of a formed capacitor can be changed.

Besides the external electrodes 7 and 8, penetrating electrodes 6 are formed in the electronic component 10. These penetrating electrodes 6 electrically connect the other electronic components that are arranged above and below the electronic component 10 of the present invention, as if there was not the electronic component of the present invention between them.

A material for forming the electrode layers 1 and 2 can be a metal such as aluminum, copper or gold or a metal compound. A material for forming the dielectric layer 3 can be a resin material such as acrylic resin, epoxy resin or vinyl resin, a ceramic material such as barium titanium oxide-based ceramic or strontium titanium oxide-based ceramic, a metallic oxide such as titanium oxide or aluminum oxide, or a semimetallic oxide such as silicon oxide. Also, a material for forming the external electrodes 7 and 8 and the penetrating electrodes 6 can be a conductive paste or a conductive polymer in addition to a metal such as gold, silver, aluminum, copper or a solder material.

The electrode layers 1 and 2 can be formed by vacuum evaporation, sputtering or plating or the like. Also, the electrode layers 1 and 2 can be formed so as to be stripe-shaped by using a solid mask with patterning, using an evaporative mask of oil or the like, or laser etching accordingly. The oil masking material can be various types of oils such as hydrocarbon-based oil, mineral oil or fluorocarbon oil.

The dielectric layer 3 can be formed by the following methods. When the resin-based material is used, it is vaporized by heating or atomized by ultrasonic waves or spraying, followed by being deposited. When the ceramic material or the metal-based material is used, sputtering, evaporation or the like can be selected.

The external electrodes 7 and 8 can be formed by thermal spraying, plating or applying a conductive paste or the like.

In order to form the penetrating electrodes 6, openings are formed in the dielectric layer 3 by the following methods. After forming the dielectric layer, dielectric in a predetermined portion is removed by laser etching. Alternatively, after applying the evaporative mask such as oil, the dielectric layer is formed. A dotted evaporative mask can be applied effectively by an ink jet system in which microdrops of a masking material are ejected from micropores.

When applying the oil mask, the oil such as hydrocarbon-based oil, mineral oil or fluorocarbon oil can be used.

When using the evaporative mask, surplus masking material that remains after forming each layer can be removed by a far-infrared ray heater, an electron beam, an ultraviolet ray lamp irradiation or a plasma irradiation when necessary.

Figure 7:
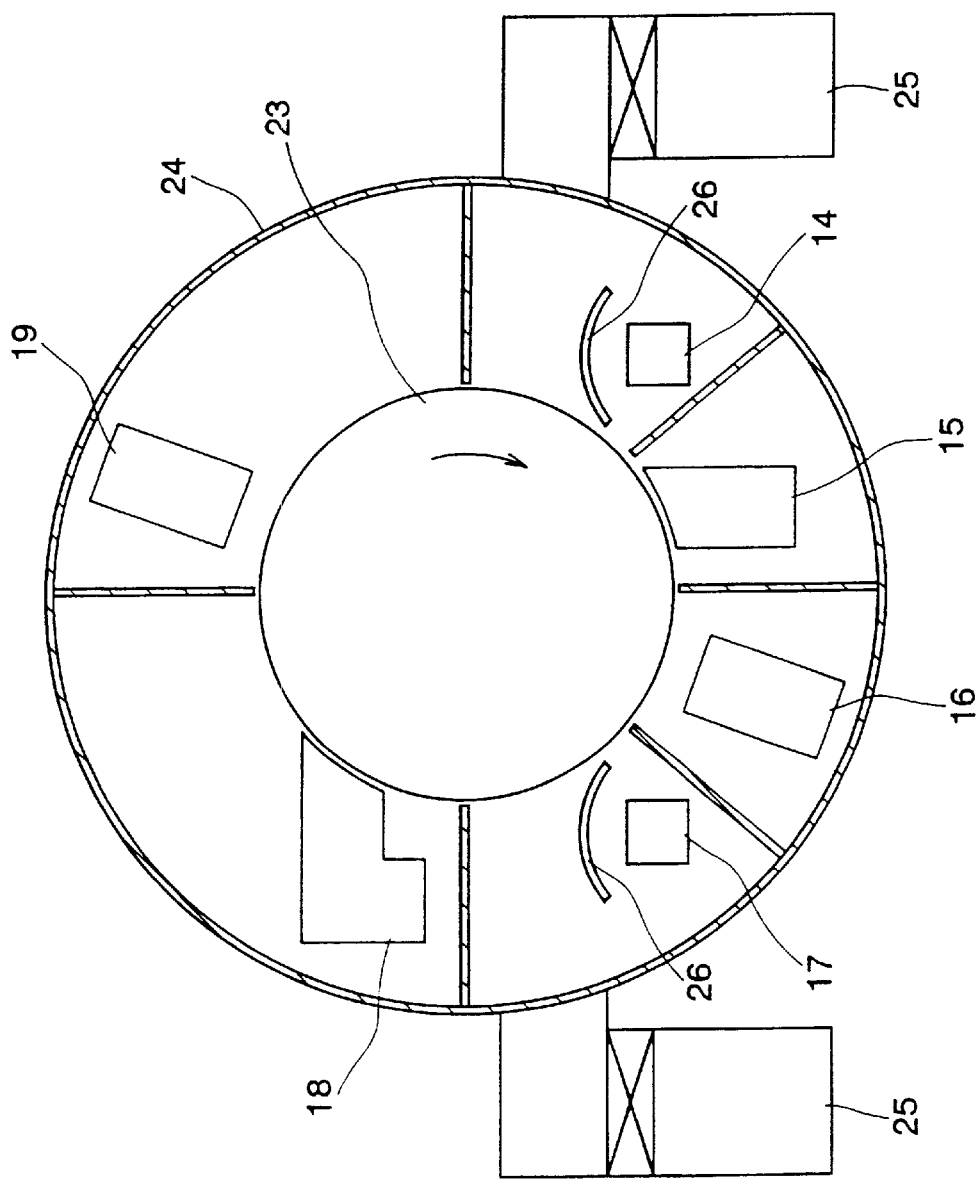
FIG. 7 is a schematic cross-sectional view showing an apparatus for manufacturing the electronic component of FIG. 5.

FIG. 7 is a schematic cross-sectional view showing a part of an example of an apparatus for manufacturing the electronic components of FIGS. 5 and 6.

A vacuum tank 24 includes a plurality of chambers that are divided by each step. Exhaust systems 25 including a vacuum pump are connected to the chambers of metal thin film-forming sources 14 and 17. A predetermined degree of vacuum is maintained in each chamber in the vacuum tank. As a conveyer system, a support that rotationally moves in an arrow direction (a cylindrical can roller 23 in FIG. 7) is arranged substantially in the center of the vacuum tank 24.

First, an insulator film-forming source (a dielectric thin film-forming source 15 or 18 in FIG. 7) forms a lower insulator film on the can roller 23. After forming the lower insulator film, the film where the penetrating electrodes will be formed may be removed to form openings (holes) by a laser beam machine 16 or 19. Shutters 26 of the metal thin film-forming sources 14 and 17 are closed here. Rotating the can roller 23 for a predetermined number of times forms the lower insulator film with a predetermined thickness. Subsequently, the shutter 26 is opened, then a combination of a metal thin film-forming source 14 and a patterning mask forms a first patterned metal thin film (a first electrode layer). Then, a dielectric thin film-forming source 15 forms a first dielectric thin film (a dielectric layer). After forming the first dielectric thin film, a laser beam machine 16 removes the dielectric thin film where the penetrating electrodes will be formed. Next, a combination of a metal thin film-forming source 17 and a patterning mask forms a second patterned metal thin film (a second electrode layer). Then, a dielectric thin film-forming source 18 forms a second dielectric thin film (a dielectric layer). Also after forming the second dielectric thin film, a laser beam machine 19 removes the dielectric thin film where the penetrating electrodes will be formed. Subsequently, the support is transmitted again to the metal thin film-forming source 14, the dielectric thin film-forming source 15, the laser beam machine 16, the metal thin film-forming source 17, the dielectric thin film-forming source 18 and the laser beam machine 19 in this order to be processed as above for predetermined times. After forming films for a predetermined number of times, the shutter 26 is closed, and then the insulator film-forming source (the dielectric thin film-forming source 15 or 18 in FIG. 7) forms an upper insulator film. After forming the upper insulator film, the film where the penetrating electrodes will be formed may be removed to form openings (holes) by the laser machine 16 or 19. Rotating the can roller 23 for a predetermined number of times forms the upper insulator film with a predetermined thickness.

The penetrating electrode is formed as follows. A conductive paste is painted to fill a penetrating hole that is formed, and then hardened.

In an appropriate step afterwards, the layered product is cut into predetermined sizes where necessary.

The external electrodes are formed on the sides of the layered product that is cut into the predetermined sizes by thermal spraying or applying a paste.

Forming the external electrodes separately by using a mask or a resist can control the number of stripe-shaped electrodes that are connected to the individual external electrodes.

Figure 8:
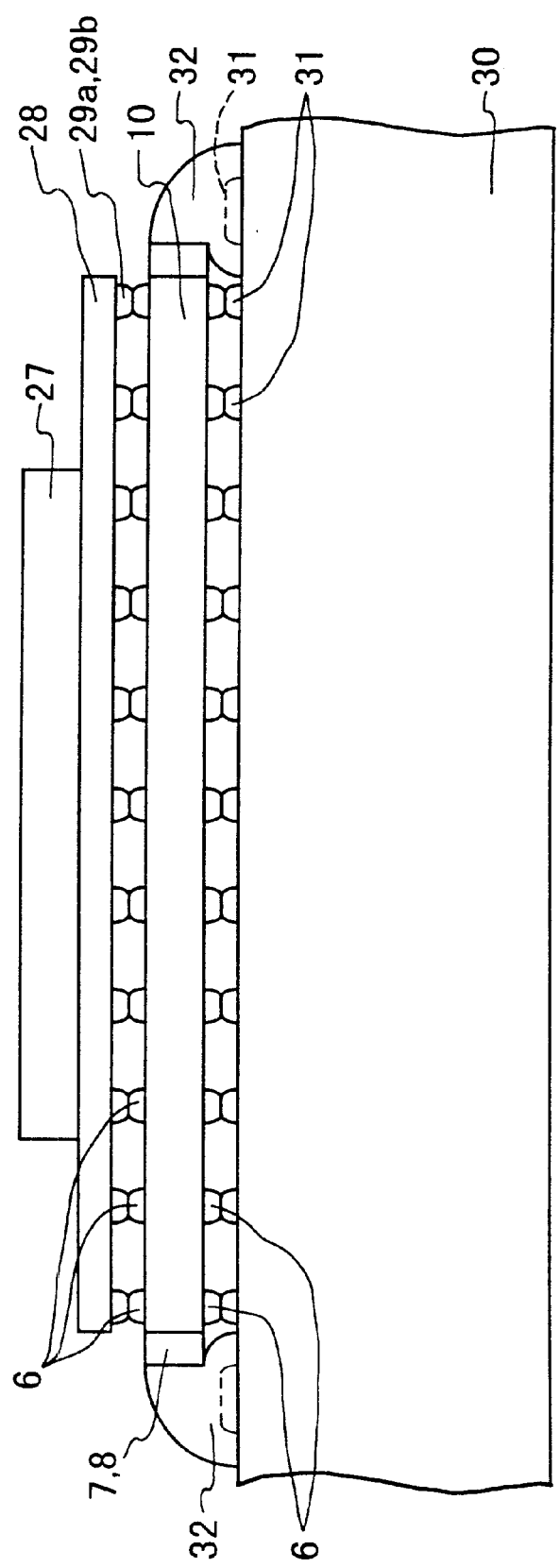
FIG. 8 is a schematic view showing an example using the electronic component of FIG. 5.

The electronic component 10 formed according to the present invention is used, for example, by locating it between a carrier 28 that has a semiconductor chip 27 mounted thereon and a wiring board 30, as is schematically shown in FIG. 8. A signal terminal 29*a* on the lower surface of the carrier 28 is connected to a wiring pattern 31, which is formed on the wiring board 30, via the penetrating electrode 6 of the electronic component 10 of the present invention when necessary. Also, one power terminal 29*b* on the lower surface of the carrier 28 is connected to the wiring board 30 via the penetrating electrode 6 and further to the first external electrode 7. The other power terminal 29*b* on the lower surface of the carrier 28 is connected to the wiring board 30 via the penetrating electrode 6 and further to the second external electrode 8. The penetrating electrode 6 and the external electrodes 7 and 8 may be connected with the wiring pattern 31 on the surface of the wiring board 30 as is shown in FIG. 8, or with other means such as the connection inside the wiring board 30 or that on the upper surface of the electronic component of the present invention. The external electrodes 7 and 8 and the wiring board 30 may be connected with soldering 32 or with other means.

Since the first electrode layer 1 connected to the first external electrode 7 and the second electrode layer 2 connected to the second external electrode 8 are insulated by the dielectric layer interposed therebetween, when a power terminal connected to the first external electrode 7 is a Vcc terminal and a power terminal connected to the second external electrode 8 is a GND terminal, for example, the capacitor formed between the first external electrode 7 and the second external electrode 8 does not substantially enlarge the mounted area and functions as a pass capacitor for power supply near the semiconductor chip. This is preferable in high frequency driving and a size reduction of the mounted area.

EXAMPLE 2

Aluminum was used as a metal thin film material, acrylate was used as a dielectric material, and silver-based paste was used as a conductive paste. For forming holes for penetrating electrodes in the dielectric layer, the following method was adopted. The method includes removing dielectric in a predetermined portion by laser etching after forming the dielectric layer. A carbon dioxide gas laser with an output of 10 W was used as the laser. Within an area 17 mm square, 484 penetrating electrodes with a diameter of 0.25 mm were formed on 0.8 mm-pitch lattice points. The electrode layers 1 and 2 were both 0.8 mm-wide multiple stripes. Depositing the electrode layer with a thickness of 30 nm and the dielectric layer with a thickness of 0.25 $\mu$m was repeated so as to obtain 140 dielectric layers. Insulator layers with a thickness of 5 $\mu$m respectively were formed on the upper and lower sides of the layered product to improve its strength. The upper and lower insulator layers were made of the same material as the dielectric layer for simplification. The upper and lower insulator layers were processed with a laser to form the penetrating electrodes. Subsequently, the layered product was cut, and a brass layer with a thickness of 20 $\mu$m was formed on the cut surface by a thermal spraying, followed by forming a solder plated layer with a thickness of 60 $\mu$m, to make an external electrode. A conductive paste was painted to fill the concave portion (opening) formed by the hole processing for the penetrating electrodes and hardened afterwards.

An LCR meter confirmed the result that a capacitor with a total capacity of 1 $\mu$F and tan $\delta$0.8% was formed inside the layered product having a thickness of about 50 $\mu$m.

(Third Embodiment)

Figure 9:
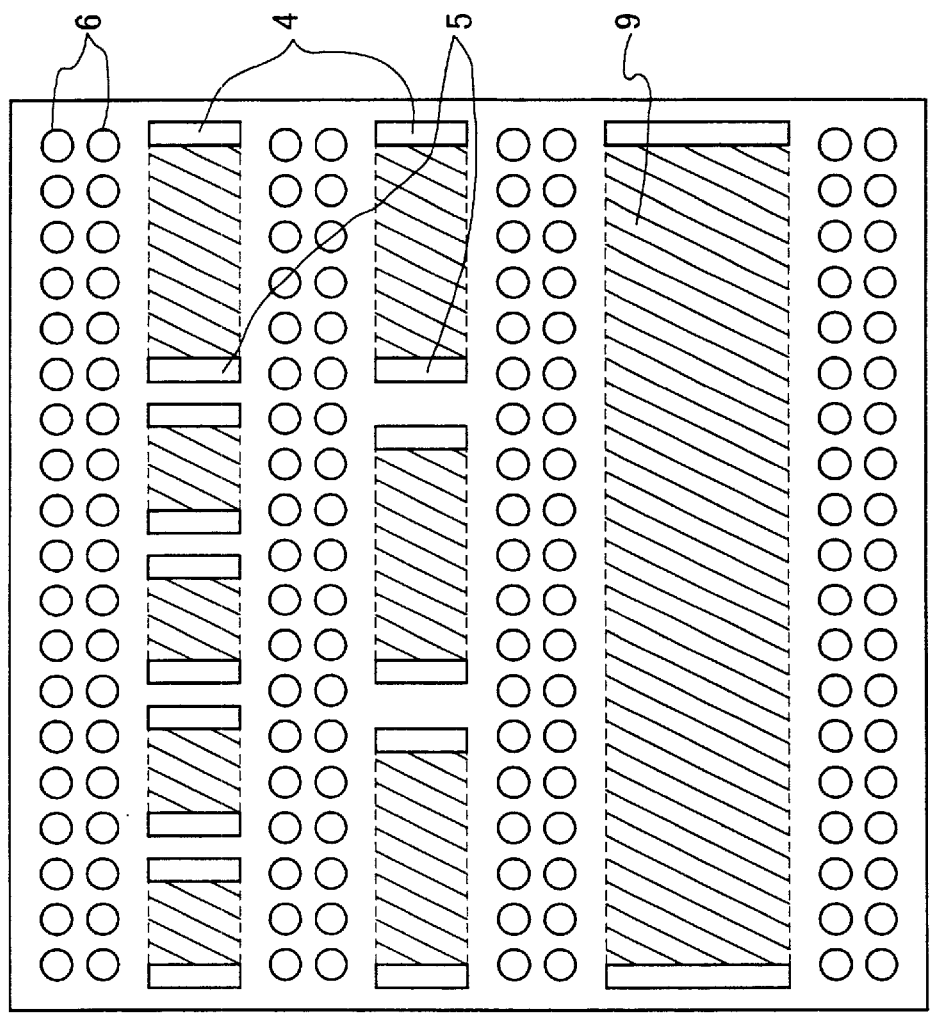
FIG. 9 is a schematic plan view showing an example of an electronic component according to the third embodiment of the present invention.
Figure 10:
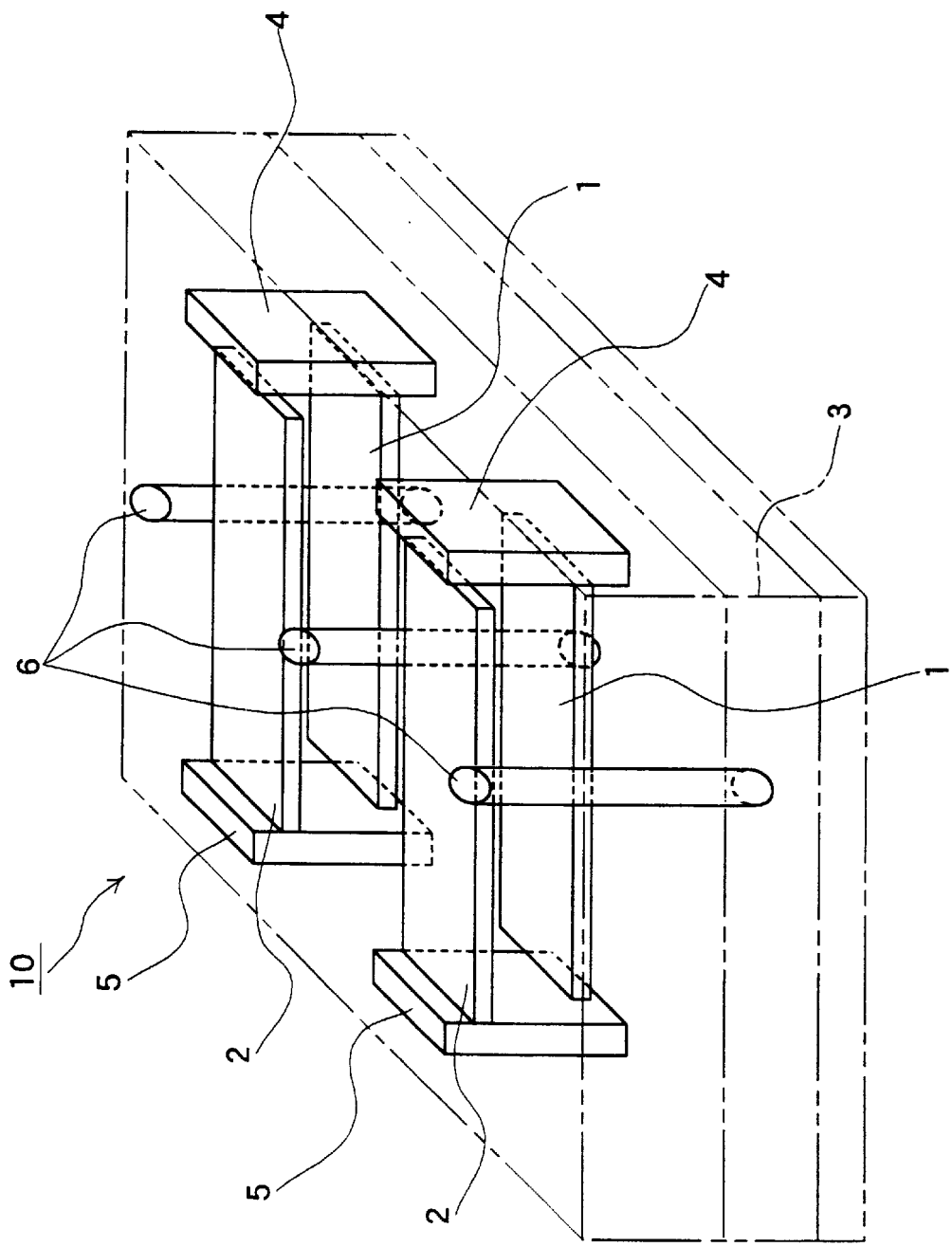
FIG. 10 is a perspective view showing an internal structure of a part of the electronic component of FIG. 9.

FIG. 9 is a schematic plan view showing an example of an electronic component 10 according to the third embodiment of the present invention. FIG. 10 is a perspective view showing an internal structure of a part of the electronic component of FIG. 9.

A plurality of first electrode layers 1 are formed in a predetermined pattern in substantially the same plane, and a plurality of second electrode layers 2 are formed in a predetermined pattern in substantially the same plane. They are layered so that a dielectric layer 3 is interposed between the first electrode layers 1 and the second electrode layers 2. By forming the first electrode layer 1 and the second electrode layer 2 so that at least a part of them overlap (face) each other, capacitance forming regions 9 are formed at the overlapped portions (facing portions) and function as capacitors. The capacitance can be changed by adjusting the size of each overlapped portion (the capacitance forming region 9).

A first lead electrode 4 is connected to the first electrode layer 1, and a second lead electrode 5 is connected to the second electrode layer 2. They can be used as joining terminals when the capacitance forming region 9 functions as capacitor as is mentioned above. The lead electrodes 4 and 5 may be formed so as to penetrate the electronic component 10 in the deposition direction as shown in FIGS. 9 and 10, or to appear only on one surface of the electronic component. It is possible that one of the lead electrodes 4 and 5 is formed so as to penetrate the electronic component, and the other one appears only on one surface thereof.

Besides the lead electrodes 4 and 5, penetrating electrodes 6 are formed in the electronic component 10. These penetrating electrodes 6 electrically connect the other electronic components that are arranged above and below the electronic component 10 of the present invention, as if there was not the electronic component of the present invention between them.

A material for forming the electrode layers 1 and 2 can be a metal such as aluminum, copper or gold or a metal compound. A material for forming the dielectric layer 3 can be a resin material such as acrylic resin, epoxy resin or vinyl resin, a ceramic material such as barium titanium oxide-based ceramic or strontium titanium oxide-based ceramic, a metallic oxide such as titanium oxide or aluminum oxide, or a semimetallic oxide such as silicon oxide. Also, a material for forming the lead electrodes 4 and 5 and the penetrating electrodes 6 can be a conductive paste or a conductive polymer in addition to a metal such as gold, silver, aluminum, copper or a solder material.

The electrode layers 1 and 2 can be formed by vacuum evaporation, sputtering or plating or the like. Also, the electrode layers 1 and 2 can be formed in the predetermined pattern (shape) such as a polygonal shape by using a solid mask with patterning, using an evaporative mask of oil or the like, or laser etching accordingly. The oil masking material can be various types of oils such as hydrocarbon-based oil, mineral oil or fluorocarbon oil.

The dielectric layer 3 can be formed by the following methods. When the resin-based material is used, it is vaporized by heating or atomized by ultrasonic waves or spraying, followed by being deposited. When the ceramic material or the metal-based material is used, sputtering, evaporation or the like can be selected.

In order to form the lead electrodes 4 and 5 and the penetrating electrodes 6, openings are formed in the dielectric layer 3 by the following methods. After forming the dielectric layer, dielectric in a predetermined portion is removed by laser etching. Alternatively, after applying the evaporative mask such as oil, the dielectric layer is formed. A dotted or linear evaporative mask also can be applied effectively by an ink jet system in which micro-drops of a masking material are ejected from micropores.

When applying the oil mask, the oil such as hydrocarbon-based oil, mineral oil or fluorocarbon oil can be used.

When using the evaporative mask, surplus masking material that remains after forming each layer can be removed by a far-infrared ray heater, an electron beam, an ultraviolet ray lamp irradiation or a plasma irradiation when necessary.

The electronic component of the present embodiment can be specifically manufactured, for example, by using the apparatus described in the first or second embodiment in a similar manner.

Figure 11:
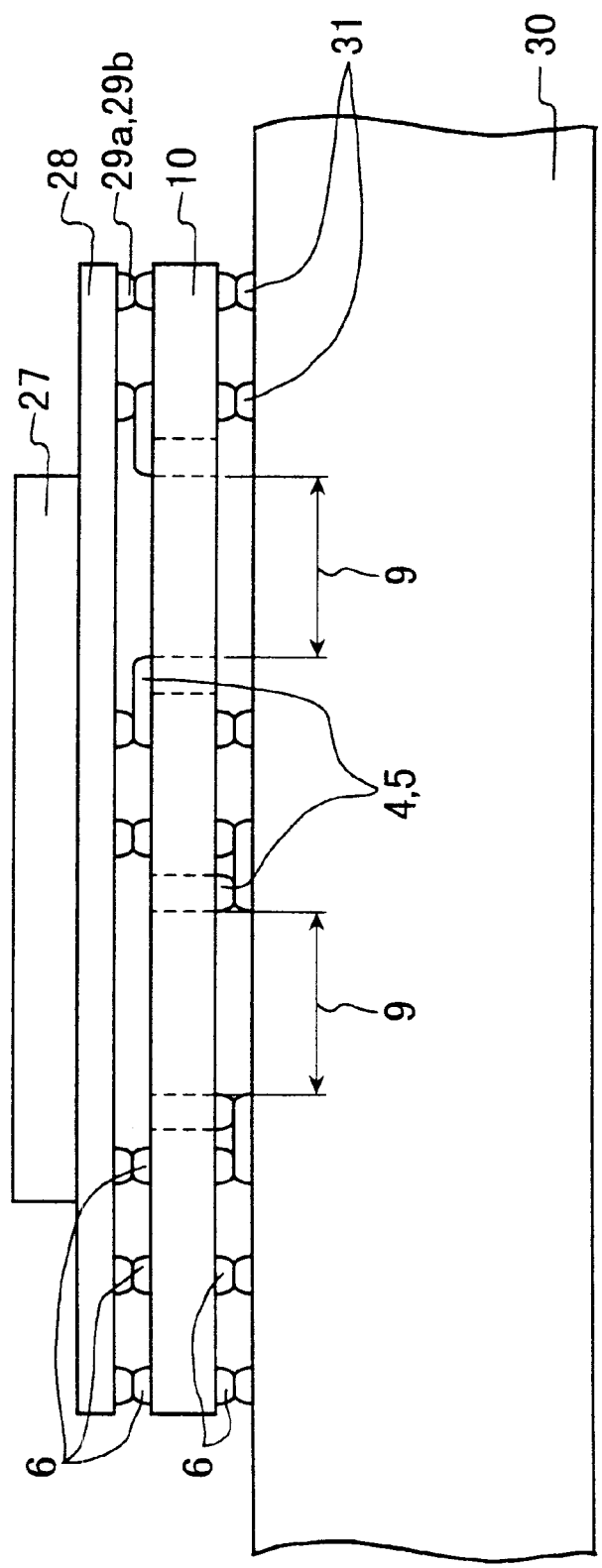
FIG. 11 is a schematic view showing an example using the electronic component of FIG. 9.

The electronic component 10 formed according to the present invention is used, for example, by locating it between a carrier 28 that has a semiconductor chip 27 mounted thereon and a wiring board 30, as is schematically shown in FIG. 11. A signal terminal 29a on the lower surface of the carrier 28 is connected to a wiring pattern 31, which is formed on the wiring board 30, via the penetrating electrode 6 of the electronic component 10 of the present invention when necessary. Also, one power terminal 29b on the lower surface of the carrier 28 is connected to the wiring board 30 via the penetrating electrode 6 and further to the first lead electrode 4. The other power terminal 29b on the lower surface of the carrier 28 is connected to the wiring board 30 via the penetrating electrode 6 and further to the second lead electrode 5. The penetrating electrode 6 and the lead electrodes 4 and 5 may be connected with the wiring pattern 31 on the surface of the wiring board 30 as is shown in FIG. 11, or with other means such as the connection inside the wiring board 30. Alternatively, the power terminal 29b on the lower side of the carrier 28 may be connected to the lead electrodes 4 and 5 on the lower side of the carrier, and then the electronic component 10 of the present invention may be connected to the wiring board 30 on the surface of the wiring board 30. Numeral 9 in FIG. 11 denotes a capacitance forming region that is formed at the overlapped portion of the first and the second metal thin films.

Since the first electrode layer 1 connected to the first lead electrode 4 and the second electrode layer 2 connected to the second lead electrode 5 are insulated by the dielectric layer interposed therebetween, when one power terminal connected to the first lead electrode 4 is a Vcc terminal and the other power terminal connected to the second lead electrode 5 is a GND terminal, for example, the capacitor formed between the first lead electrode 4 and the second lead electrode 5 does not substantially enlarge the mounted area and functions as a pass capacitor for power supply near the semiconductor chip. This is preferable in high frequency driving and a size reduction of the mounted area.

EXAMPLE 3

Aluminum was used as a metal thin film material, aluminum oxide was used as a dielectric material, and silver-based paste was used as a conductive paste. When forming an electrode layer, a solid mask with through holes was used, and when forming a dielectric layer, fluorocarbon oil was used as an oil masking material for depositing with an ink jet system. Within an area 15 mm square, 20×10 rows, that is a total of 200 penetrating electrodes having a diameter of 0.3 mm with a 0.7 mm pitch, and rectangular electrode layers 1 and 2 with a width of 1 to 2 mm are formed in various lengths between the rows of the penetrating electrodes to make capacitors having different sizes of the overlapped portions of both electrodes. A conductive paste is filled in portions defining a hole of 0.25 mm×1 mm to form two lead electrodes in each capacitor. Depositing the electrode layer with a thickness of 30 nm and the dielectric layer with a thickness of 0.3 $\mu$m was repeated so as to obtain 130 dielectric layers. Insulator layers with a thickness of 8 $\mu$m respectively were formed on the upper and lower sides of the layered product to improve its strength. The upper and lower insulator layers were made of the same material as the dielectric layer for simplification. The lower insulator layer was processed to form holes for the penetrating electrodes and the lead electrodes by masking. The upper insulator layer also was processed to form holes for the penetrating electrodes by masking. A conductive paste was painted to fill the concave portion (opening) formed by the hole processing for the penetrating electrodes and the lead electrodes and hardened afterwards.

An LCR meter confirmed the result that nine capacitors, namely four capacitors with a capacity of 0.047 $\mu$F, two capacitors with a capacity of 0.068 $\mu$F, two capacitors with a capacity of 0.1 $\mu$F and one capacitor with a capacity of 0.47 $\mu$F, with tan $\delta$1.2% were formed inside the layered product having a thickness of about 60 $\mu$m.

A material for forming the electrode layers of the present invention is not limited to that of the first to third embodiments and the Examples 1 to 3 described above, but can be a metal such as aluminum, copper or gold or a metal compound. A material for forming the dielectric layer can be a resin material such as acrylic resin, epoxy resin or vinyl resin, a ceramic material such as barium titanium oxide-based ceramic or strontium titanium oxide-based ceramic, a metallic oxide such as titanium oxide or aluminum oxide, or a semimetallic oxide such as silicon oxide. Also, a material for forming the penetrating electrodes and the lead electrodes can be a conductive polymer or a metal such as gold, silver, aluminum, copper or a solder material in addition to the conductive paste. Furthermore, a material for forming the external electrodes can be a single material selected from a conductive polymer and a metal such as brass, zinc, solder material, gold, silver and copper, in addition to the conductive paste. Alternatively, the external electrodes can be formed with a combination thereof. For example, after forming a brass layer, a conductive paste layer may be formed thereon.

In the drawings used for describing the first to third embodiments, the electrode layers are arranged so as to be perpendicular to each other when seen from above in the deposition direction to form rectangular capacitance forming regions. However, the capacitance forming regions do not have to be rectangular. For example, crossing stripe-shaped electrodes obliquely to each other can form the capacitance forming region, which is formed at the intersection, with the other shapes such as a parallelogram.

Moreover, shapes of the lead electrodes and the penetrating electrodes are not limited to those schematically shown in the drawings, but can be changed into the other shapes.

Furthermore, one electronic component may include a mixture of the structures described in the first to third embodiments. For example, after forming the electrodes so as to be stripe-shaped as is described in the first and second embodiments, some of these electrodes may be connected to the lead electrodes of the first embodiment, and the others may be connected to the external electrodes of the second embodiment. Alternatively, after forming the electrodes so as to be stripe-shaped as is described in the first and second embodiments and the electrodes in the predetermined pattern as is described in the third embodiment, some of these electrodes may be connected to the lead electrodes of the first or third embodiment, and the others may be connected to the external electrodes of the second embodiment.

Although the openings (holes) for forming the penetrating electrodes and the lead electrodes in the dielectric layer are formed by laser etching or depositing the evaporative oil every time the dielectric layer is deposited, they do not have to be formed during deposition. For example, after depositing, irradiating a laser beam in a predetermined portion may form the openings (holes). In other words, the penetrating electrode can be formed by forming a penetrating hole in a deposition direction so as not to contact any electrode layer and filling a conductive material in the penetrating hole. Also, the lead electrode can be formed by forming a hole having a predetermined depth (or a penetrating hole) so as to contact only a desired electrode layer and filling a conductive material therein so as to contact the electrode layer that is exposed to an inner wall (and a bottom portion) of this hole. Thus, this lead electrode is electrically connected to the desired electrode layer.

In addition, although the electronic component having the capacitor function is described as an example of the present invention, the electronic component of the present invention may have the other functions (for example, a coil, a noise filter or a layered circuit board etc.) other than or along with the capacitor function.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

INDUSTRIAL APPLICABILITY

As is described above, the electronic component of the present invention and the method for manufacturing the same can form a capacitance forming region, a coil, a noise filter and a layered circuit board etc. near a semiconductor chip, thereby achieving a high frequency driving of the semiconductor chip and suppressing a size increase of a mounted area. Thus, the present invention can be used, in particular, for an electronic equipment that is required to speed up the information processing effectively.

What is claimed is:

1. An electronic component comprising:
   electrode layers arranged in opposition to each other;
   a dielectric interposed between said electrode layers;
   a connecting electrode that is connected to at least one of said electrode layers; and
   penetrating electrodes that penetrate the electronic component without being connected to said electrode layers;
   wherein said penetrating electrodes are arranged like lattice points, said electrode layers comprise a first electrode layer and a second electrode layer arranged between said penetrating electrodes, and said first electrode layer and said second electrode layer are arranged so as to be crossed with each other like a lattice when seen from a penetrating direction of said penetrating electrodes and so that said dielectric is interposed therebetween.

2. The electronic component according to claim 1, wherein said first electrode layer and said second electrode layer are arranged so as to have a facing portion with a predetermined size and so that said dielectric is interposed therebetween.

3. The electronic component according to claim 1, wherein said connecting electrode is a lead electrode that is formed in the same plane as said penetrating electrode.

4. The electronic component according to claim 1, wherein said connecting electrode is an external electrode that is formed in a different plane than said penetrating electrode.

5. The electronic component according to claim 1, wherein a plurality of capacitance forming regions are formed between said first electrode layer and said second electrode layer.

6. The electronic component according to claim 5, wherein said connecting electrodes that are connected to said first electrode layers and said second electrode layers forming the capacitance forming regions are insulated from each other.

7. The electronic component according to claim 5, wherein capacitance forming regions with different capacitances are formed.

* * * * *